United States Patent
Schmid et al.

(10) Patent No.: US 6,849,989 B2
(45) Date of Patent: Feb. 1, 2005

(54) TRANSLATION AND ROTATION POSITIONING MOTOR

(76) Inventors: Andreas Schmid, 1734 Allston Way, Berkeley, CA (US) 94703; Oliver Schaff, Voltastr. 5, 13355 Berlin (DE)

( * ) Notice: Subject to any disclaimer, the term of this patent is extended or adjusted under 35 U.S.C. 154(b) by 106 days.

(21) Appl. No.: 10/284,826

(22) Filed: Oct. 31, 2002

(65) Prior Publication Data

US 2004/0084996 A1 May 6, 2004

(51) Int. Cl.[7] .............................................. H02N 2/00
(52) U.S. Cl. ................................. 310/328; 310/323.17
(58) Field of Search ............................. 310/323.27, 328

(56) References Cited

U.S. PATENT DOCUMENTS

| | | | | |
|---|---|---|---|---|
| 4,622,483 A | * | 11/1986 | Staufenberg et al. | 310/328 |
| 4,874,979 A | | 10/1989 | Rapp | 310/328 |
| 5,237,238 A | | 8/1993 | Berghaus et al. | 310/328 |
| 5,696,421 A | * | 12/1997 | Zumeris et al. | 310/328 |
| 5,942,837 A | * | 8/1999 | Reuter | 310/328 |
| 6,022,005 A | * | 2/2000 | Gran et al. | 267/136 |
| 6,029,959 A | * | 2/2000 | Gran et al. | 267/136 |
| 6,397,008 B2 | * | 5/2002 | Kuwana et al. | 396/55 |
| 6,441,536 B2 | * | 8/2002 | Fischer et al. | 310/323.17 |
| 6,452,307 B1 | * | 9/2002 | Olin et al. | 310/323.17 |

FOREIGN PATENT DOCUMENTS

| | | | | |
|---|---|---|---|---|
| JP | 01-214272 | * | 8/1989 | H02N/2/00 |
| WO | WO 93/19494 | | 3/1993 | H01L/41/08 |

OTHER PUBLICATIONS

Wittneven, C.; Dombrowski R.; "A low temperature ultra-high vacuum scanning tunneling microscope with rotatable magnetic field" Rev. Sci. Instrum., v.68, No. 10, Oct. 1997, pp. 3806–3810.

* cited by examiner

*Primary Examiner*—Thomas M. Dougherty
(74) *Attorney, Agent, or Firm*—Timothy P. Evans

(57) ABSTRACT

A positioning device provides the capability of moving an object in both a linear and a rotational direction. The positioning device includes a first piezo stack with plural piezo plates that are capable of movement in orthogonal directions with respect to each other. The positioning device further includes a second piezo stack with plural piezo plates that are capable of movement in orthogonal directions with respect to each other. The positioning device also includes a first bearing that is disposed against the first piezo stack. The positioning device further includes a second bearing that is disposed against the second piezo stack. The positioning device also includes a spring element and a fifth bearing that is disposed against the spring element. The first through fifth bearings are disposed around and against the object to be positioned, to provide for positioning of the object in at least one of a linear direction and a rotational direction.

15 Claims, 5 Drawing Sheets

\* Bearings 165B, 165D blocked from view in this top view

TRANSLATION AND ROTATION POSITIONING MOTOR

BACKGROUND OF THE INVENTION

1. Field of the Invention

The invention relates to a translation and rotation positioning motor, which can be used for providing precise linear and rotational movements of a scanning tunneling microscope, for example. In particular, the invention relates to a translation and rotation positioning motor that includes piezo actuators and that provides for movement of an object by angstrom level or sub-angstrom level increments on one or more planes, and that is capable of repeated precise realignment of the object so that it can be moved repeatedly to a desired position.

2. Description of the Related Art

Scanning tunneling microscopes (STM) are widely used in industry and in research to obtain atomic-scale images of specimen surfaces. An STM provides a three-dimensional profile of the surface, which is useful for characterizing surface roughness, observing surface defects, and determining surface structure with atomic resolution. An STM operates by providing a needle point of the STM in very close proximity to the specimen surface to be scanned, whereby the needle point is moved about the surface in a raster-like manner. The needle point is disposed at a distance from the specimen surface so that a tunneling effect is achieved, whereby, when a voltage is provided to the needle point, electrons "tunnel" from the needle point to the specimen surface. By moving the needle point with respect to an opposite point on the specimen surface in order to obtain a particular current flow, a plot of the specimen surface characteristic at that point is obtained. By rastering the needle point about different parts of the specimen surface, a three dimensional plot of the specimen surface is obtained.

In order to bring the needle point of the STM close enough (but not in contact) to the specimen surface to achieve the desired tunneling effect, the needle point is moved by way of a coarse positioning device of the STM. Once in the "tunneling region", a fine positioning device of the STM is utilized in order to obtain a precise positioning of the needle point with respect to the specimen surface to be scanned.

One such positioning device that allows for microscopic movements of a scanning tunneling microscope, and that can be used as either a coarse adjusting device or as a fine adjusting device for an STM, is described in U.S. Pat. No. 5,237,238, issued to Thomas Berghaus et al., which is incorporated in its entirety herein by reference. The Berghaus et al. patent describes various types of positioning devices, some of which allow for both linear and rotational movement of an element. FIGS. 15 and 15a of the Berghaus et al. patent show a first adjusting device that allows for both linear and rotary movement of a turntable. Referring now to FIG. 15d of the Berghaus et al. patent, rotary movement of a turntable 5 is accomplished by way of drive elements 6a and 6b, each of which includes a bearing element. Linear movement of the turntable 5 is accomplished by way of drive element 6c, which is fitted within a groove 34 on the bottom surface of the turntable 5.

FIG. 17 of the Berghaus et al. patent shows a second adjusting device that allows for both linear and rotary movement. Rotary movement of a turntable 5 is accomplished by way of a rotary adjusting device 1, while linear movement of the turntable 5 is accomplished by way of a linear adjusting device 1' (which has a bearing element of triangular cross-section).

Another conventional microscopic adjusting device is described in published European Patent Application WO 93/19494, by Shuheng Pan, which is incorporated in its entirety herein by reference. The Pan apparatus provides for microscopic movement of an object in a step-by-step manner, whereby piezo actuators (elements 2a–2d as shown in FIG. 1a of Pan) are moved individually (or in groups) in one direction successively while the remaining actuators hold the object still, and when all of the actuators have been moved, they are simultaneously moved in the opposite direction. The simultaneous movement of the actuators in the opposite direction results in linear movement of the object. Different embodiments described by Pan include an embodiment shown in FIG. 5 of Pan, which allows for rotational movement of a sphere 50 about a center point of the sphere.

None of the conventional microscopic adjusting devices described above allows for x-y-z movement of an object using a single adjusting device that provides the capability of movement of the object in both a linear direction and a rotational direction.

Also, the geometrical structure of objects being moved in the apparatuses of Berghaus and Pan are not believed by the inventors of this application to be ideal for allowing rotational and linear movement of an object.

SUMMARY OF THE INVENTION

The present invention is directed to an apparatus for moving an object by way of piezo actuators. According to one aspect of the invention, the apparatus includes a first piezo stack which has a first piezo-electric plate and a second piezo-electric plate that are disposed against each other and that are capable of movement in orthogonal directions with respect to each other. The apparatus also includes a second piezo stack which has a third piezo-electric plate and a fourth piezo-electric plate that are disposed against each other and that are capable of movement in orthogonal directions with respect to each other. The apparatus further includes a first bearing that is disposed against the first piezo stack, and a second bearing that is disposed against the second piezo stack. The apparatus still further includes a third piezo stack which has a fifth piezo-electric plate and a sixth piezo-electric plate that are disposed against each other and that are capable of movement in orthogonal directions with respect to each other. The apparatus also includes a fourth piezo stack which has a seventh piezo-electric plate and an eighth piezo-electric plate that are disposed against each other and that are capable of movement in orthogonal directions with respect to each other. The apparatus further includes a third bearing that is disposed against the third piezo stack, and a fourth bearing that is disposed against the fourth piezo stack. The apparatus further includes a fifth bearing that is disposed against a spring element. The first through fifth bearings are disposed around and against a cylindrical object to be moved in at least one of a linear direction and a rotational direction.

BRIEF DESCRIPTION OF THE DRAWINGS

The foregoing advantages and features of the invention will become apparent upon reference to the following detailed description and the accompanying drawings, of which.

DETAILED DESCRIPTION OF PREFERRED EMBODIMENTS

Preferred embodiments of the invention will be described in detail below, with reference to the accompanying drawings.

The present invention will be described below with reference to a coarse positioning device for an STM, but one of ordinary skill in the art will recognize that the present invention may be utilized for other types of positioning devices, such as for a fine positioning device for an STM, a strain motor for straining an object, or for a positioning device for an apparatus to be precisely stepped in units of angstroms and/or sub-angstroms to a particular location.

A coarse positioning device of an STM typically moves the needle tip of the STM in units of microns or millimeters, whereby a fine positioning device of the STM typically moves the needle tip of the STM in sub-micron units.

The adjusting device according to the present invention functions as a motor, and provides for multi-dimensional positioning of objects with sub-micrometer precision. The motor utilizes shear piezo-electric ceramics to drive the motion of a cylinder linearly along the axis of the cylinder, and also to provide for rotation of the cylinder, as desired. The cylinder may be used as a strain motor for straining an object to be scanned, for example, or it may be used as part of a coarse or fine adjusting element of an STM that is used to scan an object.

Figure 1:
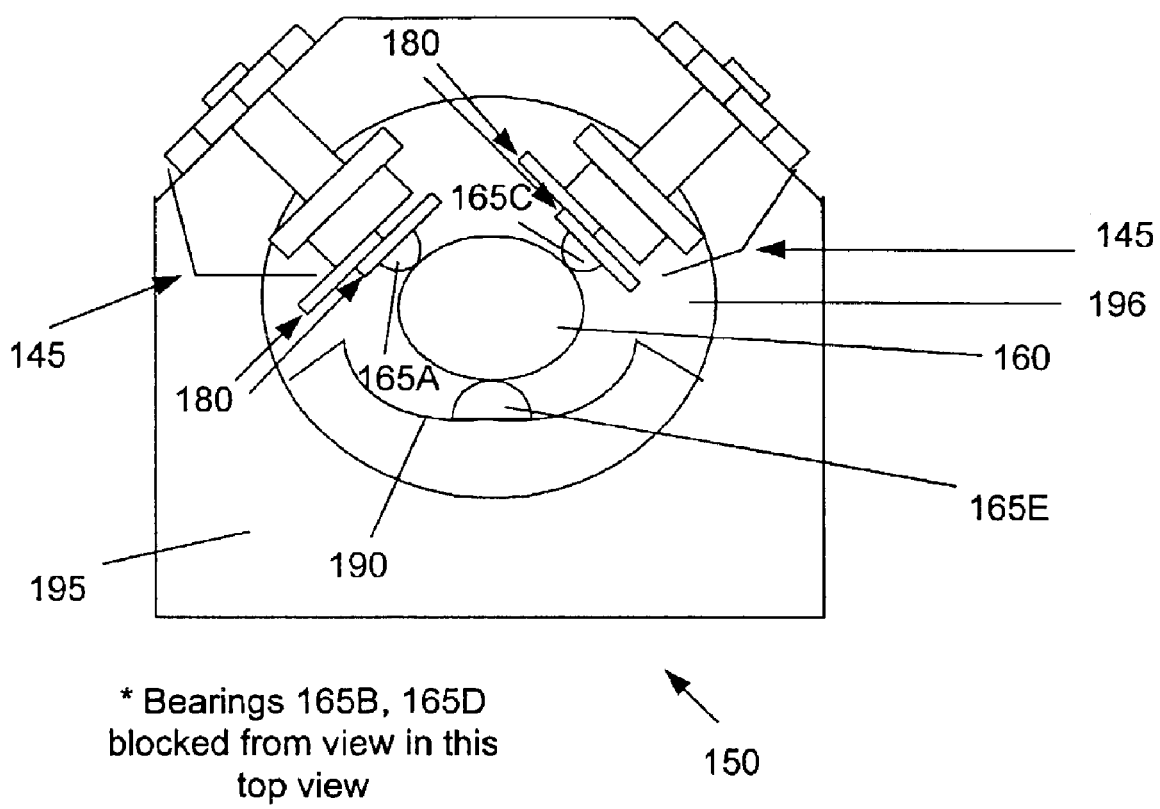
FIG. 1 shows a top view of a positioning device according to an embodiment of the invention.

FIG. 1 shows a top view of a motor 150 according to a first embodiment of the present invention. The motor 150 operates to move a cylinder 160, which is preferably a sapphire cylinder. Sapphire is chosen since the outer surface of the cylinder 160 is preferably very smooth, to allow for positioning the cylinder 160 in precise, small amounts by way of bearings that slide on the outer surface of the cylinder 160. One of ordinary skill in the art will recognize that other materials for the cylinder 160 may be contemplated, such as tungsten carbide or polished steel, whereby those other materials provide for a hard and very smooth outer surface of the cylinder 160, and whereby the outer surface of the cylinder 160 is not damaged (e.g., not scratched) by bearings sliding thereon. The inventors have found that the material construction of the cylinder 160 should be harder than the material construction of the bearings supporting the cylinder 160, so that the bearings do not damage the outer surface of the cylinder as they slide on the outer surface.

With regards to the object to be adjusted, the first embodiment of the present invention is used to position a cylindrical object, which is different from the prism-shaped object structure of Pan (see FIG. 2A of Pan) or the hexagonal-shaped object structure of Berghaus et al. (see FIG. 6 of Berghaus et al.), each of which has flat surfaces. By using a cylinder (which has no flat surfaces on an outer circumferential surface thereof) as the object to be positioned in the first embodiment, the first embodiment of the present invention allows for both rotational and linear movement of the cylinder by way of a plurality of bearings disposed around and against the outer circumferential surface of the cylinder.

In particular, due to the configuration of the object to be positioned in the present invention having a cylindrical shape, smooth rotational movement to any amount of rotation (e.g., 360 degrees rotation) and smooth linear translational movement to any amount of translation is possible. This is a feature that is not possible when the object to be positioned is a prism (as in Pan) or a hexagon (as in Berghaus et al.), which both prevent rotation.

In an STM configuration, a needle tip or probe (not shown) is fitted onto one end of the cylinder 160. The needle tip or probe is used to obtain a plot of the surface of a specimen (e.g., top surface of a fabricated semiconductor device) to be scanned by the STM, as described previously.

In the first embodiment, by way of example and not by way of limitation, the sapphire cylinder 160 is ½ inch in diameter and 1 inch in length. Of course, other sizes of cylinders may be contemplated while remaining within the scope of the invention. The cylinder 160 is held in place within the motor 150 by five bearings 165A–165E (only bearings 165A, 165C and 165E are shown in the top view of FIG. 1, since bearings 165B and 165D are blocked from view), whereby the bearings 165A–165D are preferably alumina bearings, and whereby the bearing 165E is preferably a Teflon bearing. Other constructions for the bearings 165A–165D may be contemplated, such as aluminum metal, or tungsten carbide, which allow for smooth sliding of the bearings on the outer circumferential surface of the cylinder 160. Though not shown in FIG. 1, bearings 165B and 165D are positioned beneath the bearings 165A and 165C, respectively, in the same manner as piezo actuators 80B and 80D are positioned with respect to piezo actuators 80A and 80C in the plan view of FIG. 6, which shows a different embodiment.

Each of the bearings 165A–165D is mounted on a piezo stack that includes two piezo plates 180, whereby each one of the bearings 165A–165D is capable of moving independently of the other three bearings. In the first embodiment, the bearings 165A–165D are either half-balls or half-cylinders, which are glued directly to the respective top piezo plates. Other ways of fixedly adhering the bearings 165A–165D to the top piezo plate besides gluing may be contemplated while remaining within the scope of the invention. If half-cylinders are used for the bearings, the axis of the half-cylinders should be oriented at 90degrees with respect to the cylinder 160.

Figure 4:
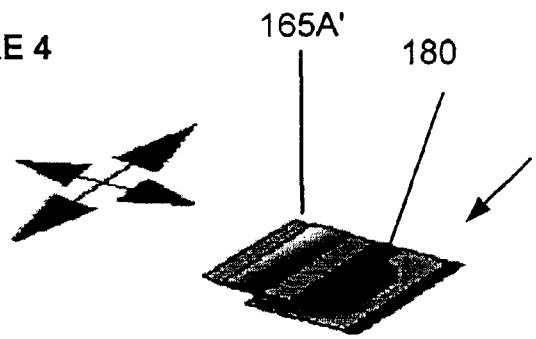
FIG. 4 shows a plan view of a biaxial piezo actuator that may be utilized in an embodiment of the invention.

FIG. 4 shows a biaxial piezo actuator 80A, which includes a half-cylinder bearing 165A' instead of a half-ball bearing. FIG. 4 also shows the two axes by which the bearing 165A' can move due to the shearing of one or both of the two piezo plates that are part of the biaxial piezo actuator 80A.

The bearings 165A–165D are configured to slide on the outer surface of the cylinder 160. In the first embodiment, the fifth bearing 165E is also preferably a half-ball or a half-cylinder, which is affixed (e.g., glued) to a leaf spring.

Referring back to FIG. 1, the fifth bearing 165E is fixed (e.g., glued) to a spring 190, which is preferably a stainless steel leaf spring. The spring 190 provides a sufficient pressure to the cylinder 160 by way of the fifth bearing 165E, to thereby hold the cylinder 160 in place with respect to the first through fourth bearings 165A–165D that are also in contact with an outer circumferential surface of the cylinder 160. By way of example and not by way of limitation, the amount of pressure exerted on the cylinder 160 by the combination of the leaf spring 190 and the fifth bearing 165E is 1 to 2 Newtons.

The bearing 165E is preferably a Teflon-coated bearing in the first embodiment, whereby it acts as a slippery bearing and provides less friction force than any of the other bearings to the outer circumferential surface of the cylinder 160. Other types of constructions may be envisioned to provide for a slippery bearing as the fifth bearing 165E, such as polished alumina or tungsten carbide, while remaining within the scope of the invention.

The purpose of the combination of the leaf spring 190 and the fifth bearing 165E is to allow the motor 150 to be operated in any orientation, such as a sideways position, an upside-down position, and/or to allow the motor 150 to operate in a zero-gravity environment, for example. By way of the pressure provided to the cylinder 160 from the combination of the leaf spring 190 and the fifth bearing 165E, the cylinder 160 is held in place among the first through fifth bearings 165A–165E. The cylinder 160 is moved by way of linear and/or rotational force provided by way of the motor 150 according to the first embodiment.

As seen in FIG. 1, the first and second bearings 165A, 165B are preferably disposed 120 degrees apart from the third and fourth bearings 165C, 165D, with the fifth bearing disposed 120 degrees apart from the first and second bearings 165A, 165B, and disposed 120 apart from the third and fourth bearings 165C, 165D, along an outer circumference of the cylinder 160. The piezo plate/bearing structures are shown fitted onto a chassis 195, with the cylinder 160 disposed within a bore 196 of the chassis 195 and held in place by way of the first through fifth bearings 165A–165E. Coupling units 145, each of which preferably includes a screw, a nut and a washer, hold the first through fourth bearings 165A–165D in place onto the chassis 195. The fifth bearing 165E and the leaf spring 190 are also held in place within the chassis 195 by being snugly fit within the bore 196 with the cylinder 160 already disposed within the bore 196. The fifth bearing 165E is disposed at a position between the first through fourth bearings 165A–165D along the longitudinal axis of the cylinder 160. Preferably, the fifth bearing 165E is positioned against a mid-point (with respect to a length direction) of the cylinder 160.

Figure 2A:
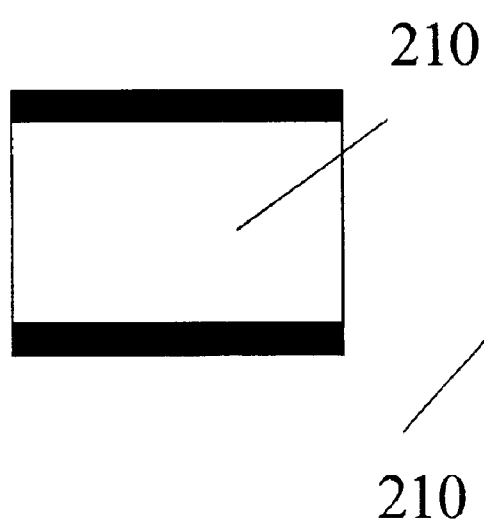
FIG. 2a shows an unactuated piezo-electric element that may be used in the positioning device according to an embodiment of the invention.
Figure 2B:
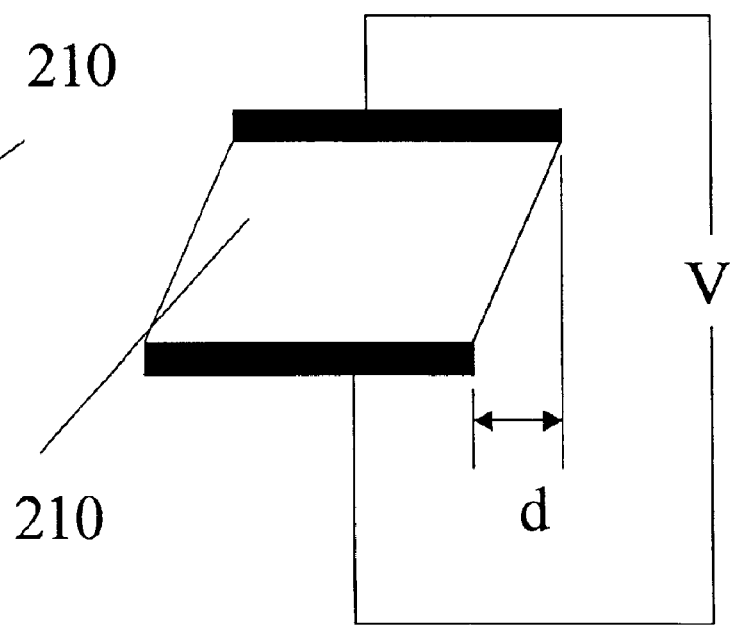
FIG. 2b shows an actuated piezo-electric element that may be used in the positioning device according to an embodiment of the invention.

Motion is provided to the cylinder 160 by activating one or more of the piezo-electric ceramic plates 180, to thereby move the bearings 165A–165D that are disposed against the cylinder 160. FIG. 2A shows the shape of a shear piezo-electric ceramic plate 210 with no voltage applied to it. When a voltage is applied to it, the piezo-electric plate 210 deforms or shears, as shown in FIG. 2B. The size of the deformation or shearing, d, can be controlled by the size of the voltage applied to the piezo-electric plate 210. By way of example and not by way of limitation, a voltage of 200 volts applied to the top and bottom conductive plates of the piezo-electric plate 210 results in a 1.0 micron deformation or shearing of the piezo-electric plate 210 (distance "d"). A lesser voltage applied to the piezo-electric plate 210 will result in a concomitant lesser amount of deformation, as is known to those skilled in the art.

Referring back to FIG. 1, in the first embodiment, each of the piezo stacks 180 includes two piezo-electric plates 180 disposed against each other to form a stack. In the first embodiment, the piezo plates 180 of one piezo stack are oriented such that one piezo-electric plate deforms along the axis of the cylinder 160, while the other piezo-electric plate deforms perpendicular to the axis of the cylinder 160.

In a second embodiment of the invention, the piezo stacks are disposed in a manner such that a first piezo plate 180 deforms along an axis 45 degrees with respect to an axis of the cylinder 160, while a second piezo plate 180 deforms along an axis orthogonal to the axis at which the first piezo plate deforms. With such a disposition, when a voltage is applied across one of the piezo plates of a piezo stack, the cylinder 160 is caused to move in a spiral (both linear and rotationally at the same time) manner. When a voltage is applied across both piezo plates 180 of a two-plated piezo stack at the same time, the maximum stroke that the cylinder 160 can be moved at one time is increased to 1.414 (square root of two)*d, in order to get a larger stroke or movement of the bearing coupled to the piezo plates 180.

Figure 3:
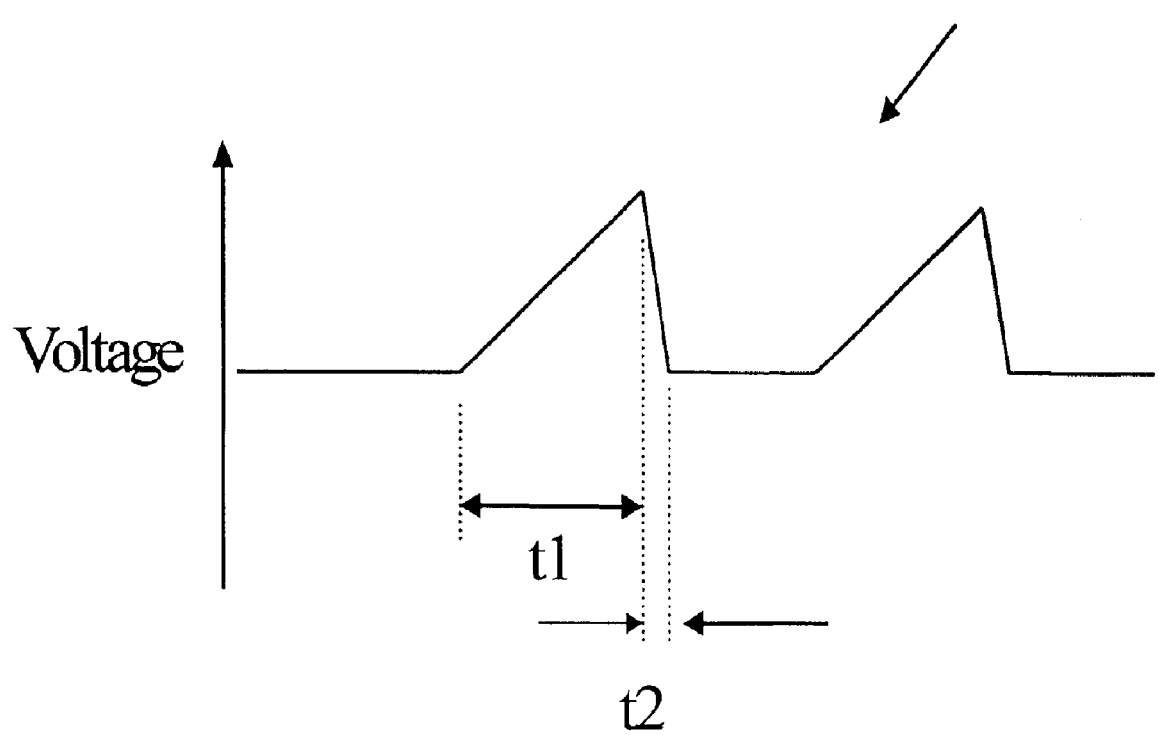
FIG. 3 shows a voltage waveform that may be used to provide movements of the piezo-electric elements used in the positioning device according an embodiment of the invention.

In either the first or second embodiments, motion of the cylinder 160 is preferably achieved by an asymmetric voltage profile using the voltage waveform 300 as shown in FIG. 3. The voltage waveform 300 is preferably provided by way of a voltage generator (not shown) being controlled by a microprocessor, for example. Of course, other ways of providing a suitable voltage waveform may be contemplated, while remaining within the scope of the invention.

In the example provided below, assume that the voltage waveform shown in FIG. 3 is provided to the piezo-electric ceramic plates 180 that are coupled to the bearings 165A, 165B, 165C, and 165D. The increase of voltage in a linear manner during the time period t1 is slow enough so that as the piezo-electric ceramic plates 180 move the bearing 165B attached to it due to the shearing of the piezo-electric ceramic plates 180, the static friction between the bearings 165A,B,C,D and the cylinder 160 is not broken. The static friction between the cylinder 160 and the fifth bearing 165E is smaller than the static friction between the cylinder 160 and the bearings 165A,B,C,D. As a result, during the time period t1, the cylinder 160 moves with the movement of the bearings 165A,B,C,D a distance "d" (see also FIG. 2B). During this time period t1, the cylinder 160 slips on the bearing 165E. Depending on which one of the two piezo-electric plates 180 (see also FIG. 4) is provided with the voltage waveform 300 of FIG. 3, this movement of the cylinder 160 may be either a linear movement or a rotational movement, or a combination of the two, if both plates are caused to shear simultaneously.

Following the motion of the bearings 165A,B,C,D (and the accompanying movement of the cylinder 160), the voltage is rapidly dropped within a time period t2, which moves the piezo-electric ceramic plates 180 holding the bearings 165A,B,C,D back to their original shape (see also FIG. 2A). This causes the bearings 165A,B,C,D to snap back to its original position, whereby the bearings 165A,B,C,D move back the distance "d" with respect to the cylinder 160. Due to the sharp voltage drop during the time period t2, acceleration of the bearings 165A,B,C,D is large enough so as to break the static friction between the bearings 165A,B, C,D and the cylinder 160. Also, the inertia of the cylinder 160 is large enough such that it does not follow the quick snapping motion of the bearings 165A,B,C,D during the time period t2.

Accordingly, the bearings 165A,B,C,D slide over the outer surface of the cylinder 160 during the time period t2. This results in no movement of the cylinder 160 as the bearings 165A,B,C,D move quickly back to their "default" or "home" position at the end of the time period t2. The result is that the net motion of the cylinder 160 is approximately the distance "d" during the combined time periods t1 and t2.

The properties of the shear piezo-electric ceramic plates 180 allow for movements of the cylinder 160 to be at an amount "d" of between 1 nanometer to 1 micrometer or more. The actual amount of movement is dependent on the size and type of piezo plates used, and the amount of deformation that can be obtained by applying a voltage across the piezo plates.

In the first embodiment, the time period t1 must be long enough to allow the cylinder 160 to move without the bearings 165A,B,C,D sliding along its outer surface. If a maximum displacement of the piezo plate is desired, the voltage ramps up from 0 volts to 200 volts during the time period t1, for example. A convenient time period t1 has been determined by the inventors to be, for example, 1 millisecond, when alumina bearings are used to move a sapphire cylinder. Also, the time period t2 must be short enough to not allow the cylinder 160 to move as the bearings are snapped back to their original positions as the piezo plates 180 coupled to the bearings return to their original non-deformed shape. A convenient time period t2 has been determined by the inventors to be, for example, 3 microseconds. Of course, one of ordinary skill in the art will recognize that the time periods t1 and t2 depend on many specific details, for example on the material composition of the bearings 165A–165E and material composition of the cylinder 160 to be moved by the bearings 165A–165E. Accordingly, other time period limitations for t1 and t2 may be envisioned, based on the material compositions of the bearings and cylinders.

The stack of two shear piezo-electric ceramic plates 180 positioned behind each of the four active bearings 165A–165D, whereby the plates 180 are oriented in perpendicular directions with respect to each other, permits both linear translation and rotation of the cylinder 160, which allows for flexible positioning of the cylinder 160.

Two degrees of freedom of movement of a cylindrical object, one linear and the other rotational, are obtained by way of a positioning device in accordance with the present invention. Also, by providing different control voltage waveforms to different shear-piezo plates at the same time in the present invention, the cylinder 160 can be moved both linearly and rotationally at the same time, such as in a spiral manner, or in any desired manner (e.g., two degree rotation of the cylinder 160 while at the same time the cylinder 160 is moved in a linear direction two microns towards a surface to be scanned).

Figure 6:
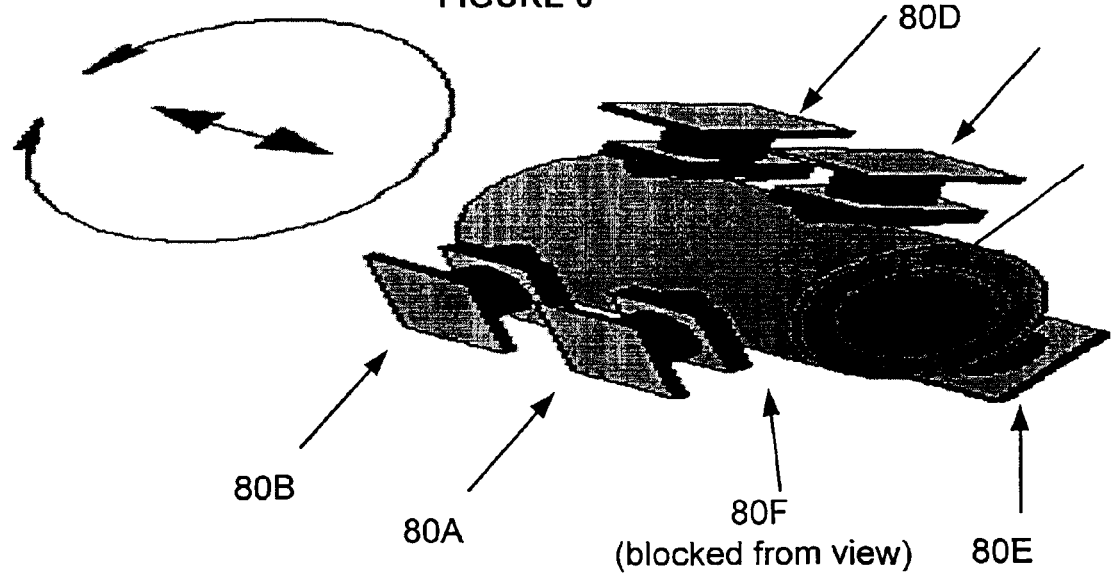
FIG. 6 shows a plan view of biaxial piezo actuators provided on a cylindrical object, in accordance with an embodiment of the invention.

In a third embodiment of the invention, the structure is the same as the first embodiment, except that instead of using a combination of a leaf spring 190 and a slippery bearing 165E to maintain a proper amount of pressure to hold the cylinder 160 in place among the bearings, two bearings each having respective piezo plates are used. Thus, six active bearings are disposed around the cylinder 160 in the third embodiment and are used to move the cylinder 160 either rotationally or linearly, or both. FIG. 6 shows a structure of six bi-axial piezo actuators 80A–80F disposed around a cylinder 160, according to the third embodiment of the invention.

Figure 5:
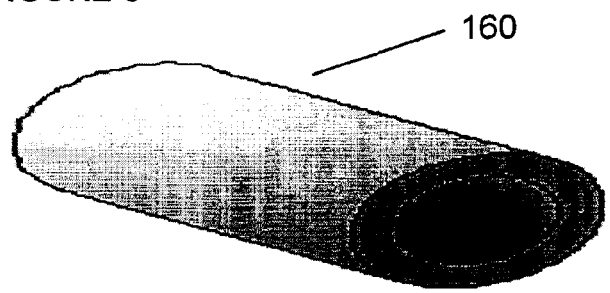
FIG. 5 shows a plan view of a cylindrical object that may be positioned in accordance with an embodiment of the invention.

FIG. 5 shows a sapphire cylinder 160 by itself, which is an object to be positioned by way of a plurality of bi-axial piezo actuators. The cylinder 160 preferably is a hollow tube, to thereby allow a device to be fitted (e.g., through-bolted) to the cylinder 160, whereby that device can be used to stress and/or flex a sample in a desired manner.

By way of example and not by way of limitation, the range of motion of the cylinder 160 shown in FIG. 6 is 10 mm of linear movement and 360 degrees of rotational movement, with a 1 nanometer accuracy. The force provided to the cylinder 160 as the cylinder 160 is held in place among the first through sixth actuators 80A–80F is on the order of 1–2 Newtons.

Figure 7:
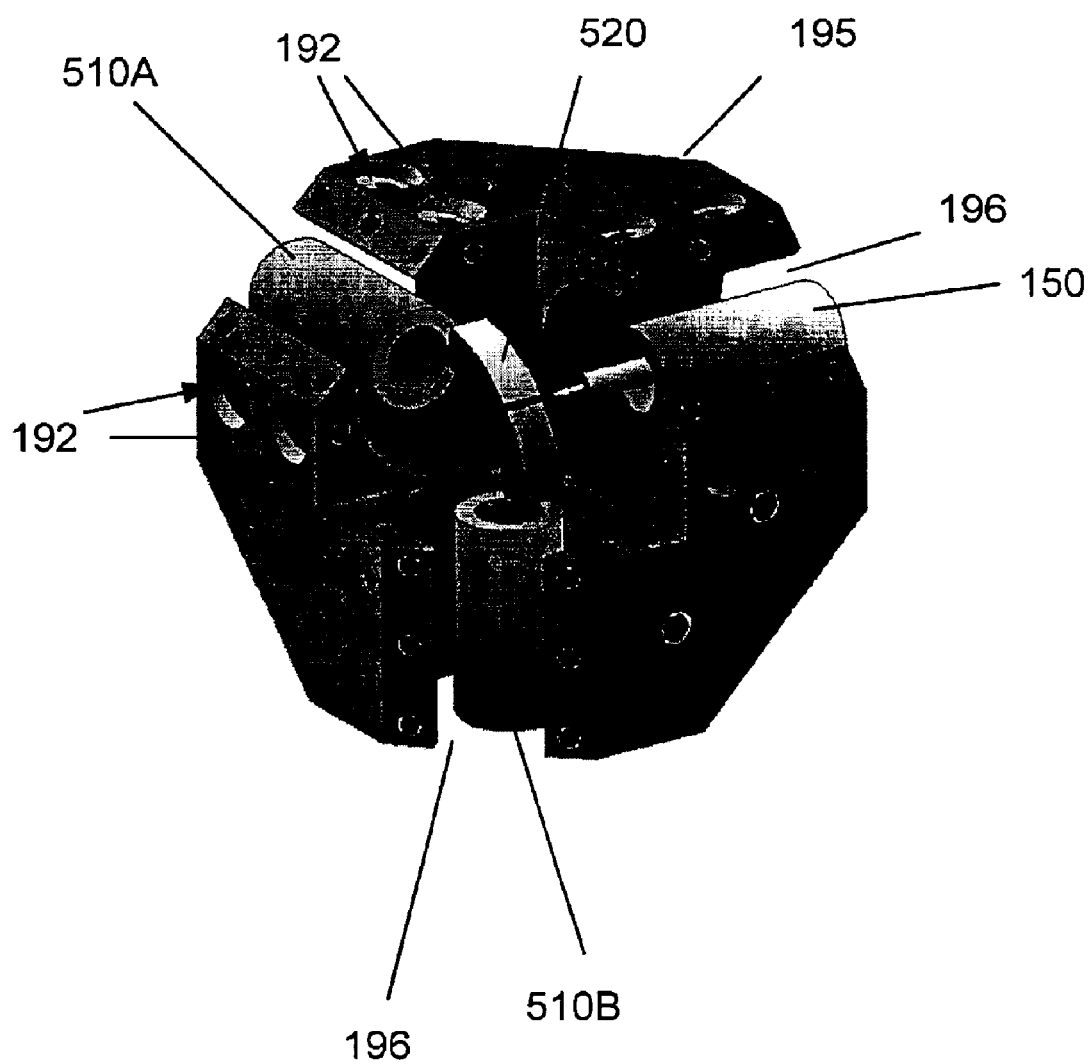
FIG. 7 shows a plan view of a three-dimensional sample stressing and scanning device, in accordance with an embodiment of the invention.

FIG. 7 shows a three dimensional positioning and scanning device 810 according to the fourth embodiment of the invention, whereby the bi-axial piezo actuators are not shown in that figure (but they are shown in FIG. 6) in order to more clearly show the structure of the chassis that holds the actuators in place. Three cylinders 510A, 510B, 160 are provided, each of which is orthogonally positioned with respect to the other two cylinders (e.g., one cylinder 150 is situated on an x-axis, one cylinder 510A is situated on a y-axis, and one cylinder 510B is situated on a z-axis).

In the fourth embodiment, cylinder 150 functions as an STM, while cylinders 510A, 510B operate as stress motors for stressing and/or flexing the sample to a desired amount along the y-axis and the z-axis. Each cylinder 150, 510A, 510B is positioned within a respective bore 196 of the chassis 195, and can be rotated or linearly positioned within its respective bore 196. Four small holes 192 are provided on the chassis 860 for each bore 196, whereby a bi-axial piezo actuator (see FIG. 4) is fitted within each respective hole 192 and held in place by way of a screw/washer/nut assembly such as assembly 145 shown in FIG. 1, for example.

In more detail, by way of example and not by way of limitation, as each cylinder is placed within its respective bore 196 of the chassis 195, the first through fourth actuators 80A–80D for that cylinder are screwed into their respective holes 192 of the bore 196, and tightened in place. Then, a leaf spring, with a fifth actuator affixed thereto, is fitted within the bore 196, to thereby fit snugly in place within the bore 196 to thereby press the cylinder against the first through fourth actuators 80A–80D.

While the fourth embodiment is described with respect to five actuators, six actuators are used in a fifth embodiment, whereby the fifth and sixth actuators are 'active' actuators (with piezo plates used to move those actuators), and are similar in structure to the first through fourth actuators of the fourth embodiment. That structure is shown in FIG. 6.

The fifth and sixth actuators are preferably fitted onto a teeter-totter (not shown) and are slid into the bore 196 after the cylinder and the first through fourth actuators have been positioned and affixed to the chassis 195. FIG. 2B of Pan describes a suitable teeter-tooter arrangement that may be utilized in the fourth embodiment. Each cylinder,is snugly fit in place within its respective bore 196 with each of the first through sixth actuators pressed against the outer surface of the cylinder.

The structure shown in FIG. 7 is capable of straining a sample in a variety of directions, while also being capable of scanning the sample 520 while it is being strained by one or both of the strain motors 510A, 510B, in order to determine the effects of the straining on the sample 520.

Different embodiments of the present invention have been described according to the present invention. Many modifications and variations may be made to the techniques and structures described and illustrated herein without departing from the spirit and scope of the invention. Accordingly, it should be understood that the apparatuses described herein are illustrative only and are not limiting upon the scope of the invention.

What is claimed is:

1. A positioning apparatus for positioning an object, comprising:
   a first piezo stack which includes a first piezo-electric plate and a second piezo-electric plate that are disposed against each other and that are capable of movement in different directions;
   a second piezo stack which includes a third piezo-electric plate and a fourth piezo-electric plate that are disposed against each other and that are capable of movement in different directions;
   a first bearing that is disposed against the first piezo stack;
   a second bearing that is disposed against the second piezo stack;
   a third piezo stack which includes a fifth piezo-electric plate and a sixth piezo-electric plate that are disposed against each other and that are capable of movement in different directions;
   a fourth piezo stack which includes a seventh piezo-electric plate and an eighth piezo-electric plate that are disposed against each other and that are capable of movement in different directions;
   a third bearing that is disposed against the third piezo stack; and
   a fourth bearing that is disposed against the fourth piezo stack;
   a spring element; and
   a fifth bearing that is disposed against the spring element,
   wherein the first through fifth bearings are disposed around and against the object to provide for positioning of the object in at least one of a linear direction and a rotational direction.

2. The apparatus according to claim 1, wherein the object to be positioned is a cylindrical object.

3. The apparatus according to claim 2, wherein the cylindrical object is a sapphire cylindrical object.

4. The apparatus according to claim 1, wherein the first and second bearings are alumina bearings.

5. The apparatus according to claim 1, wherein the fifth bearing is a Teflon bearing, which provides a predetermined force to the object to hold the object in place between the first through fourth adjusting elements.

6. The apparatus according to claim 1, wherein the first piezo-electric plate and the third piezo-electric plate shear in a first direction along a major axis of the object, and wherein the second piezo-electric plate and the fourth piezo-electric plate shear in a second direction perpendicular to the major axis of the object.

7. The apparatus according to claim 3, wherein the first and third adjusting elements are disposed 120 degrees apart from each other with respect to an outer circumferential surface of the cylindrical object.

8. The apparatus according to claim 1, wherein the first and third bearings are in alignment with each other along a plane tangential to an outer circumferential surface of the object.

9. The apparatus according to claim 8, wherein the second and fourth bearings are in alignment with each other along a second plane tangential to the outer circumferential surface of the object.

10. The apparatus according to claim 8, wherein the first through fourth bearings are either half-ball bearings or half-cylindrical bearings.

11. The apparatus according to claim 10, wherein the fifth bearing is a slippery bearing.

12. The apparatus according to claim 1, further comprising:
    a voltage control unit that outputs a voltage control signal to at least one of the first through fourth bearings,
    wherein the voltage control signal includes a first voltage signal output during a first time period in which the first voltage signal increases in voltage from zero to a first level at less than a first predetermined rate, and
    wherein the voltage control signal includes a second voltage signal output during a second time period in which the second voltage signal decreases in voltage from the first level to zero at greater than a second predetermined rate.

13. The apparatus according to claim 12, wherein the first predetermined rate is 200 volts per millisecond.

14. The apparatus according to claim 12, wherein the second predetermined rate is 66.7 volts per microsecond.

15. The apparatus according to claim 13, wherein the second predetermined rate is 66.7 volts per microsecond.

* * * * *